(12) United States Patent
Yoshida et al.

(10) Patent No.: US 12,034,029 B2
(45) Date of Patent: Jul. 9, 2024

(54) IMAGING DEVICE AND METHOD FOR PRODUCING IMAGING DEVICE

(71) Applicant: SONY SEMICONDUCTOR SOLUTIONS CORPORATION, Kanagawa (JP)

(72) Inventors: Atsushi Yoshida, Kumamoto (JP); Yuuji Kishigami, Kumamoto (JP); Hidetsugu Otani, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 372 days.

(21) Appl. No.: 17/250,246

(22) PCT Filed: Mar. 19, 2019

(86) PCT No.: PCT/JP2019/011362
§ 371 (c)(1),
(2) Date: Dec. 21, 2020

(87) PCT Pub. No.: WO2020/003647
PCT Pub. Date: Jan. 2, 2020

(65) Prior Publication Data
US 2021/0273004 A1   Sep. 2, 2021

(30) Foreign Application Priority Data
Jun. 29, 2018   (JP) .................................. 2018-124465

(51) Int. Cl.
*H01L 27/146*   (2006.01)
(52) U.S. Cl.
CPC .. *H01L 27/14636* (2013.01); *H01L 27/14618* (2013.01); *H01L 27/14683* (2013.01)

(58) Field of Classification Search
CPC ... H01L 27/146–14893; H01L 29/765–76891; H01L 29/66946–66962
See application file for complete search history.

(56) References Cited

U.S. PATENT DOCUMENTS

| 2004/0223072 | A1 | 11/2004 | Maeda et al. |
| 2006/0017128 | A1* | 1/2006 | Harazono ............. H04N 23/57 257/433 |

(Continued)

FOREIGN PATENT DOCUMENTS

| CN | 1551619 A | 12/2004 |
| CN | 104380705 A | 2/2015 |

(Continued)

OTHER PUBLICATIONS

International Search Report and Written Opinion of PCT Application No. PCT/JP2019/011362, issued on Jun. 18, 2019, 13 pages of ISRWO.

*Primary Examiner* — Evren Seven
*Assistant Examiner* — Cole Leon Lindsey
(74) *Attorney, Agent, or Firm* — CHIP LAW GROUP

(57) ABSTRACT

To reduce deformation of an imaging device and to prevent a reduction in image quality. The imaging device includes an imaging element, a substrate, and a connection portion. The substrate included in the imaging device is formed of an organic substrate and an inorganic substrate, the organic substrate including an insulation layer that is made of an organic material, the inorganic substrate including an insulation layer that is made of an inorganic material. The imaging element included in the imaging device is bonded to the substrate. The connection portion included in the imaging device connects the substrate included in the imaging device and the imaging element included in the imaging device.

17 Claims, 10 Drawing Sheets

(56) References Cited

U.S. PATENT DOCUMENTS

| | | | |
|---|---|---|---|
| 2012/0104524 A1* | 5/2012 | Takeshita | H01L 27/14618 |
| | | | 257/E31.127 |
| 2015/0130975 A1 | 5/2015 | Ueno et al. | |
| 2016/0104738 A1 | 4/2016 | Luan | |
| 2016/0366774 A1 | 12/2016 | Hasegawa et al. | |
| 2017/0186672 A1* | 6/2017 | Yamada | H01L 27/14618 |

FOREIGN PATENT DOCUMENTS

| | | |
|---|---|---|
| CN | 105657296 A | 6/2016 |
| EP | 1475960 A2 | 11/2004 |
| EP | 2869549 A1 | 5/2015 |
| JP | 62-109356 A | 5/1987 |
| JP | 04-200161 A | 7/1992 |
| JP | 10-321830 A | 12/1998 |
| JP | 2004-335794 A | 11/2004 |
| JP | 2005-242242 A | 9/2005 |
| JP | 2012-069851 A | 4/2012 |
| JP | 2013-183425 A | 9/2013 |
| JP | 2017-005199 A | 1/2017 |
| JP | 2017-041546 A | 2/2017 |
| KR | 10-0614476 B1 | 8/2006 |
| KR | 10-2015-0031415 A | 3/2015 |
| WO | 2014/002860 A1 | 1/2014 |

* cited by examiner

IMAGING DEVICE AND METHOD FOR PRODUCING IMAGING DEVICE

CROSS REFERENCE TO RELATED APPLICATIONS

This application is a U.S. National Phase of International Patent Application No. PCT/JP2019/011362 filed on Mar. 19, 2019, which claims priority benefit of Japanese Patent Application No. JP 2018-124465 filed in the Japan Patent Office on Jun. 29, 2018. Each of the above-referenced applications is hereby incorporated herein by reference in its entirety.

TECHNICAL FIELD

The present disclosure relates to an imaging device and a method for producing the imaging device. In particular, the present disclosure relates to an imaging device that is formed into a hollow package, and a method for producing the imaging device.

BACKGROUND ART

Conventionally, an imaging device is formed into a hollow package in which a cover portion is bonded to a substrate on which an imaging element in the form of a semiconductor chip is mounted, the cover portion including a transparent member such as a glass plate that is arranged in a portion of the cover portion. This is for irradiating incident light onto the imaging element. An image of a subject is formed on the imaging element through the glass plate of the cover portion using an imaging lens that is arranged outside of the imaging element. Further, the hollow package is hermetically sealed in order to prevent dust from entering. However, the hermetic sealing causes a change in an internal pressure in the imaging device, and this results in a failure. For example, an adhesive is used to bond the cover portion and the substrate, and heating is performed to cure the adhesive upon the bonding. The internal pressure in the imaging device is increased due to the heating, and this results in a failure, such as the fact that there is a change in a positional relationship between the imaging element and the imaging lens, and this results in being unable to hold an optical axis and a focal position.

For example, an imaging device in which a through-hole is formed in a substrate and filled with a breathable resin, has been proposed as an imaging device that prevents the occurrence of the above-described failure due to a change in internal pressure (for example, refer to Patent Literature 1). In the imaging device, an increase in internal pressure is suppressed even when the air in the imaging device is expanded, since the expanded air is dissipated outward through the breathable resin.

CITATION LIST

Patent Literature

Patent Literature 1: Japanese Patent Application Laid-open No. 2012-069851

DISCLOSURE OF INVENTION

Technical Problem

In the related art described above, there is a problem in which it is not possible to accurately maintain a positional relationship between the imaging element and the imaging lens when the imaging device is deformed due to a factor other than a change in internal pressure. The imaging device includes a plurality of members each having a different thermal expansion coefficient, such as the imaging element and the substrate. These members are distorted when they are expanded or contracted in response to a change in temperature that is caused when they are used, and this results in the entire imaging device being deformed, such as it being bent. In the related art described above, there is a problem in which, for example, it is not possible to accurately maintain a positional relationship between the imaging element and the imaging lens in such a case and this results in a reduction in image quality.

The present disclosure has been achieved in view of the problems described above, and an object of the present disclosure is to reduce deformation of an imaging device due to a change in temperature and to prevent a reduction in image quality.

Solution to Problem

The present disclosure has been achieved to solve the problems described above, and a first aspect of the present disclosure is an imaging device that includes an imaging element; a substrate to which the imaging element is bonded, the substrate being formed of an organic substrate and an inorganic substrate, the organic substrate including an insulation layer that is made of an organic material, the inorganic substrate including an insulation layer that is made of an inorganic material; and a connection portion that connects the substrate and the imaging element.

Further, in the first aspect, the imaging element may be bonded to a surface of the organic substrate or the inorganic substrate, and the connection portion may connect the substrate to which the imaging element is bonded, and the imaging element.

Further, in the first aspect, one of the organic substrate and the inorganic substrate may include an opening, and the imaging element may be bonded to another of the organic and inorganic substrates through the opening.

Further, in the first aspect, the connection portion may connect the substrate including the opening and the imaging element.

Further, in the first aspect, the connection portion may connect the substrate to which the imaging element is bonded, and the imaging element.

Further, in the first aspect, the substrate to which the imaging element is bonded may include a second opening, and the imaging element may be irradiated with incident light through the second opening.

Further, in the first aspect, the substrate may be formed by joining the organic substrate and the inorganic substrate using a conductive material.

Further, in the first aspect, the connection portion may be formed of a conductive wire.

Further, in the first aspect, the connection portion may be formed of a solder.

Further, in the first aspect, the connection portion may be formed of a bump that is formed in at least one of the substrate or the imaging element.

Further, in the first aspect, the organic substrate may include a wiring layer that is made of copper.

Further, in the first aspect, a cover portion that covers the imaging element may be further included.

Further, a second aspect of the present disclosure is a method for producing an imaging device, the method including bonding an imaging element to a substrate that is formed of an organic substrate and an inorganic substrate, the organic substrate including an insulation layer that is made of an organic material, the inorganic substrate including an insulation layer that is made of an inorganic material; and connecting the substrate and the imaging element using a connection portion that is used to connect the substrate and the imaging element.

Due to such aspects, the substrate to which the imaging element is bonded is formed of an organic substrate and an inorganic substrate, the organic substrate including an insulation layer that is made of an organic material, the inorganic substrate including an insulation layer that is made of an inorganic material. Accordingly, the substrate is formed of a plurality of materials each having a different thermal expansion coefficient, and this results in adjusting distortion. Deformation of the entire imaging device is expected to be reduced.

Advantageous Effects of Invention

The present disclosure provides an excellent effect of reducing deformation of an imaging device and preventing a reduction in image quality.

MODE(S) FOR CARRYING OUT THE INVENTION

Next, modes for carrying out the present disclosure (hereinafter referred to as embodiments) will be described with reference to the drawings. In the accompanying drawings, the same or similar portions will be denoted by the same or similar reference symbols. However, the figures are schematic ones, and, for example, a ratio of dimensions of respective components is not necessarily the same as the actual one. Further, of course, a certain figure and another figure have different dimensional relationships and different ratios of dimensions with respect to the same portion. Moreover, the embodiments will be described in the following order.

1. First Embodiment
2. Second Embodiment
3. Third Embodiment
4. Fourth Embodiment
5. Fifth Embodiment 1. First Embodiment

[Appearance of Imaging Device]

Figure 1:
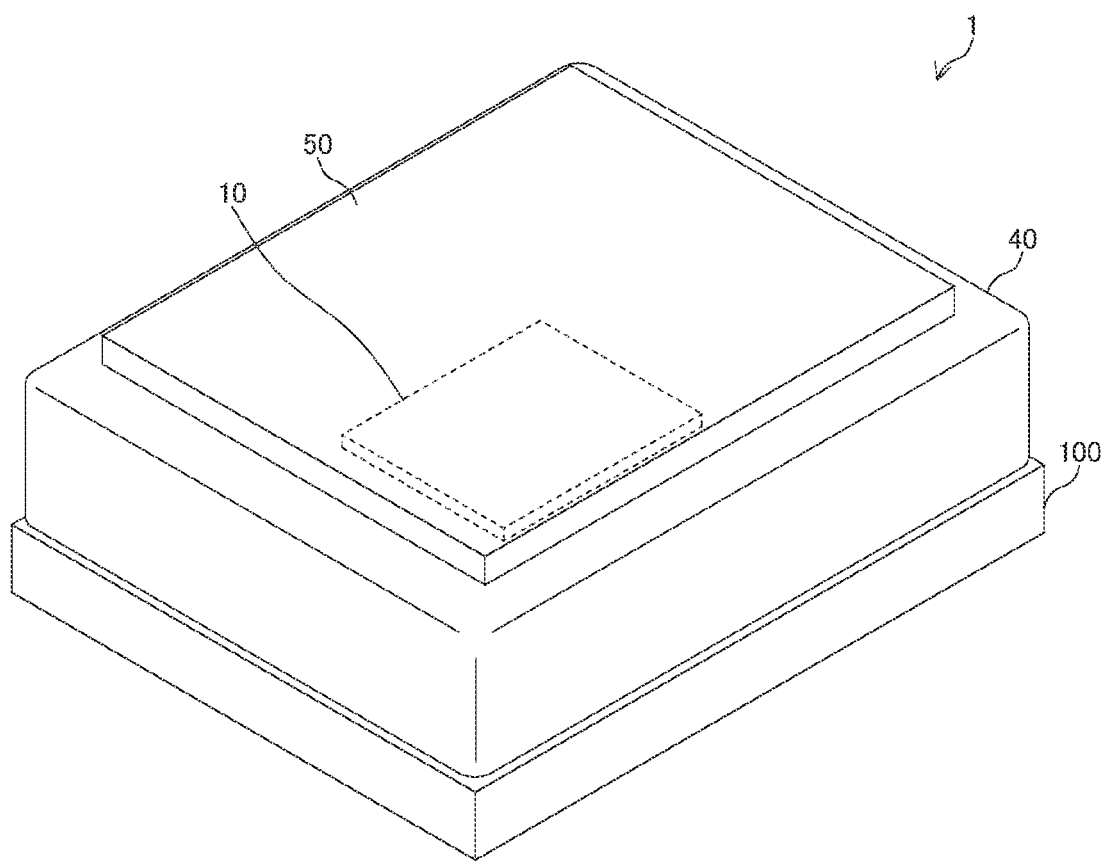
FIG. 1 illustrates a configuration example of an imaging device according to embodiments of the present disclosure.

FIG. 1 illustrates a configuration example of an imaging device according to embodiments of the present disclosure. The figure illustrates an appearance of an imaging device 1. The imaging device 1 illustrated in the figure includes a substrate 100 on which an imaging element 10 is arranged, and a cover portion that includes a frame 40 and a seal glass 50 and is bonded to the substrate 100. The imaging element 10 is a semiconductor device that is in the form of a semiconductor chip and images a subject. The substrate 100 is a substrate on which the imaging element 10 is mounted and that transmits an electric signal of the imaging element 10. The cover portion described above covers the imaging element 10 and is bonded to the substrate 100. The imaging element 10 is encapsulated and hermetically sealed using the substrate 100 and the cover portion. This makes it possible to prevent dust or the like from entering the imaging device 1.

[Configuration of Imaging Element]

Figure 2:
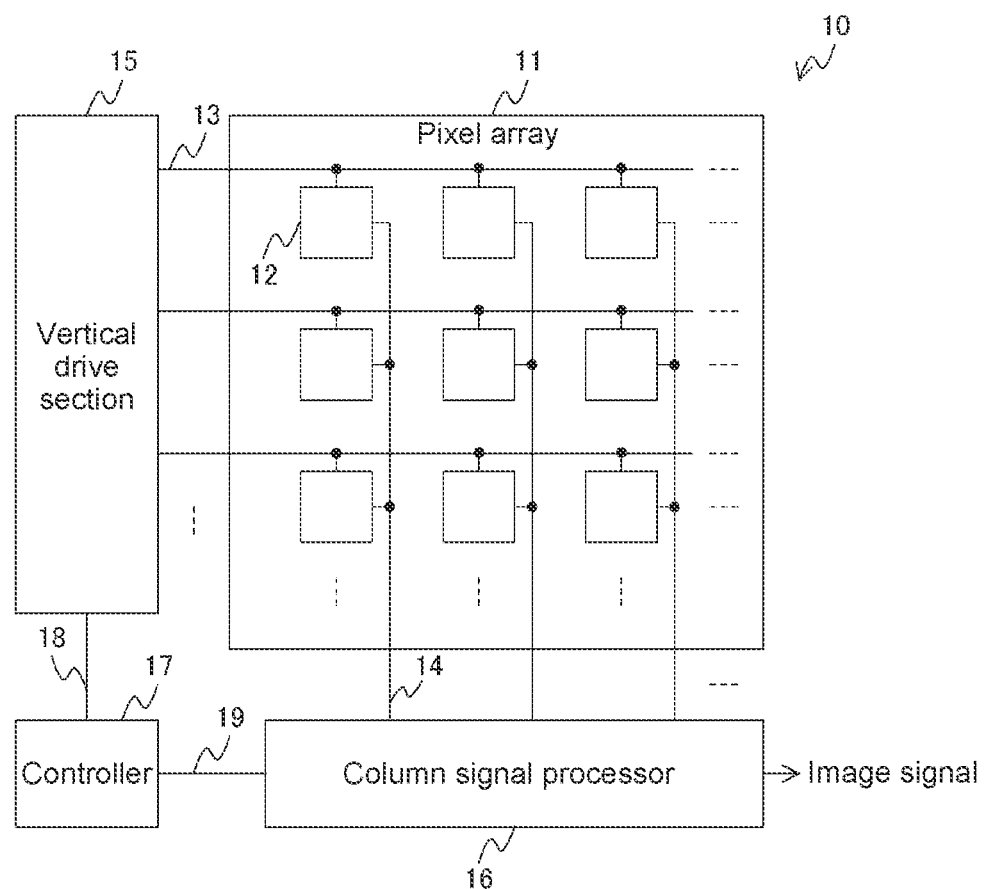
FIG. 2 illustrates a configuration example of an imaging element according to the embodiments of the present disclosure.

FIG. 2 illustrates a configuration example of an imaging element according to the embodiments of the present disclosure. The imaging element 10 in the figure includes a pixel array 11, a vertical drive section 15, a column signal processor 16, and a controller 17.

The pixel array 11 includes pixels 12 arranged in a two-dimensional grid. Here, the pixel 12 generates an image signal depending on irradiated light. The pixel 12 includes a photoelectric converter that generates a charge depending on irradiated light. The pixel 12 further includes a pixel circuit. The pixel circuit generates an image signal based on a charge generated by the photoelectric converter. The generation of an image signal is controlled by a control signal generated by the vertical drive section 15 described later. The pixel array 11 includes signal lines 13 and 14 arranged in an XY matrix. The signal line 13 is a signal line that transmits a control signal for the pixel circuit in the pixel 12. The signal line 13 is arranged for each row of the pixel array 11 and routed in common with respect to the pixels 12 arranged in each row. The signal line 14 is a signal line that transmits an image signal generated by the pixel circuit of the pixel 12. The signal line 14 is arranged for each column of the pixel array 11 and routed in common with respect to the pixels 12 arranged in each column. The photoelectric converter and the pixel circuit are formed in a semiconductor substrate.

The vertical drive section 15 generates a control signal for the pixel circuit of the pixel 12. The vertical drive section 15 transmits the generated control signal to the pixel 12 through the signal line 13 in the figure. The column signal processor 16 processes an image signal generated by the pixel 12. The column signal processor 16 processes the image signal transmitted from the pixel 12 through the signal line 14 in the figure. The processing performed by the column signal processor 16 corresponds to, for example, an analog-to-digital conversion that converts an analog image signal generated in the pixel 12 into a digital image signal. The image signal processed by the column signal processor 16 is output as an image signal of the imaging element 10. The controller 17 controls the entire imaging element 10. The controller 17 controls the imaging element 10 by generating and outputting a control signal used to control the vertical drive section 15 and the column signal processor 16. The control signal generated by the controller 17 is transmitted to the vertical drive section 15 and the column signal processor 16 respectively through signal lines 18 and 19.

[Configuration of Imaging Device]

Figure 3A:
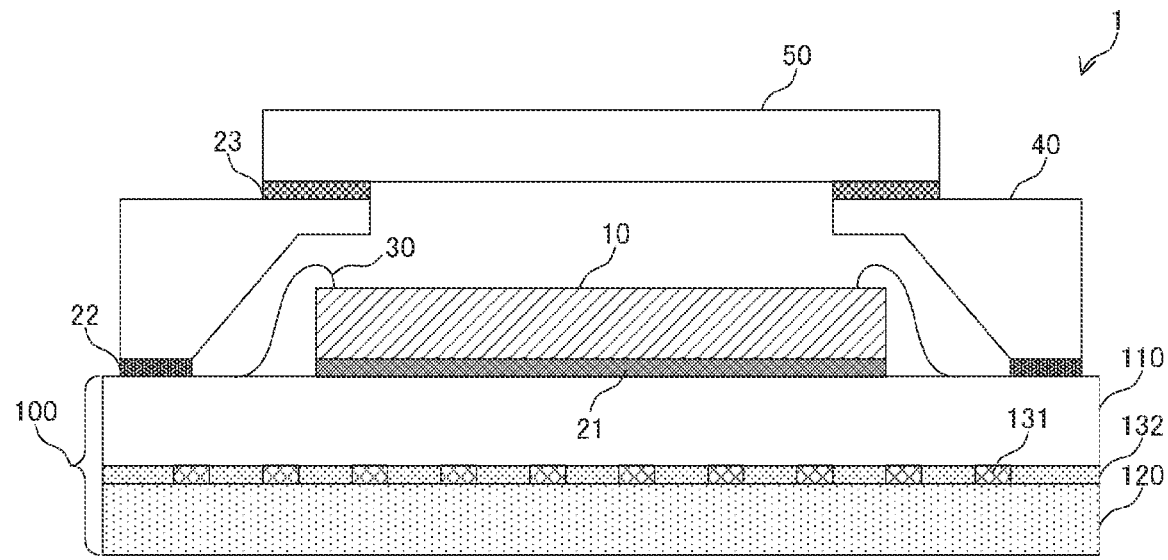
FIGS. 3A and 3B illustrate a configuration example of the imaging device according to a first embodiment of the present disclosure.
Figure 3B:
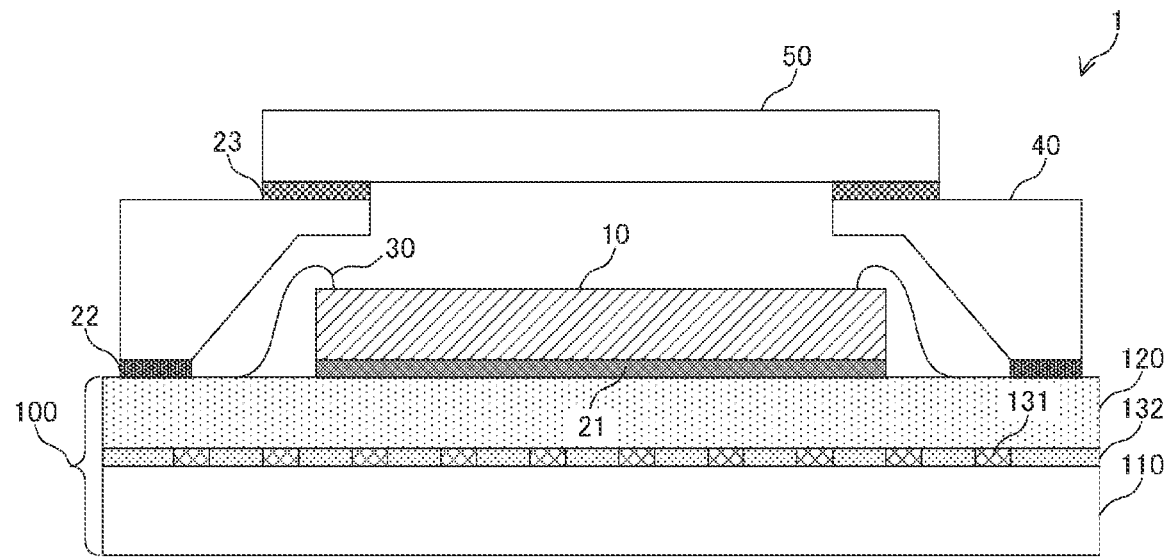

FIGS. 3A and 3B illustrate a configuration example of the imaging device according to a first embodiment of the present disclosure. The figure illustrates a cross-sectional view of the configuration example of the imaging device 1. The imaging device 1 in the figure includes the imaging element 10, the substrate 100, the frame 40, the seal glass 50, a conductive wire 30, a die-bonding material 21, and adhesives 22 and 23. Note that FIGS. 3A and 3B each illustrate an example of the imaging device 1 that includes the substrate 100 having a different configuration.

As described above, the imaging element 10 is a semiconductor chip that generates and outputs an image signal. The imaging element 10 includes the pixel array 11 arranged in an upper portion in the figure, and a pad is formed in a peripheral portion of a light-receiving surface of the imaging element 10, the light-receiving surface being a surface on which the pixel array 11 is arranged. Here, the pad is an electrode formed on the surface of a substrate or the like. The conductive wire 30 described later is connected to the pad.

The substrate 100 is a substrate on which the imaging element 10 is mounted. A pad 114 described later is also formed in the substrate 100, and the conductive wire 30 is connected to the substrate 100. A detailed configuration of the substrate 100 will be described later.

The die-bonding material 21 is used to bond the imaging element 10 to the substrate 100 when the imaging element 10 is die-bonded to the substrate 100.

The conductive wire 30 is used to electrically connect the imaging element 10 to the substrate 100. As described with reference to FIG. 2, an image signal is output from the imaging element 10. Further, the imaging element 10 is mounted on a substrate of, for example, a camera, and imaging performed by the imaging element 10 is controlled. A signal for this control is input to the imaging element 10. The conductive wire 30 is used to transmit those signals. The conductive wire may be made of, for example, gold (Au) wire, and is arranged by wire bonding.

The frame 40 is formed into a wall surrounding the imaging element 10 to protect the imaging element 10. The frame 40 may be made of, for example, resin.

The seal glass 50 is used to seal the imaging element 10, and light from a subject is transmitted through the seal glass 50 to enter the imaging element 10. The light transmitted through the seal glass 50 enters the light-receiving surface of the imaging element 10, and is irradiated onto the pixel 12. As described above, the frame 40 and the seal glass 50 forms the cover portion.

The adhesive 22 is used to bond the frame 40 and the substrate 100. Further, the adhesive 23 is used to bond the seal glass 50 and the frame 40. A thermosetting adhesive or a photo-curable adhesive may be used as the adhesives.

As described above, the substrate 100 is a substrate on which the imaging element 10 is mounted. A substrate that is formed of an organic substrate 120 and an inorganic substrate 110 may be used as the substrate 100. Here, the organic substrate 120 is a substrate that includes an insulation layer made of an organic material, and the inorganic substrate 110 is a substrate that includes an insulation layer made of an inorganic material. FIG. 3A illustrates an example in which the inorganic substrate 110 is arranged on the side of the surface on which the imaging element 10 is arranged, and FIG. 3B illustrates an example in which the organic substrate 120 is arranged on the side of the surface on which the imaging element 10 is arranged.

A substrate includes a wiring layer that is a layer of wiring used to transmit a signal, and an insulation layer that isolates the wiring layer. The organic substrate 120 is a substrate that includes the insulation layer made of an organic material. For example, an insulation layer that is made only of resin, and an insulation layer that is made of a resin composition obtained by impregnating a base material such as a glass fabric with resin correspond to the insulation layer of the organic substrate 120. Further, for example, a phenol resin, an epoxy resin, or a polyimide resin may be used as the resin. For example, a wiring layer made of copper (Cu) may be used as the wiring layer of the organic substrate 120.

An organic material has a higher thermal expansion coefficient than an inorganic material described later. Thus, the organic substrate 120 using an organic material as an insulation layer has the property of being greatly expanded and contracted due to a change in temperature. Further, the organic substrate 120 has the property of being less rigid and being aged as it absorbs moisture, since the organic substrate 120 is made of an organic material.

On the other hand, in the organic substrate 120, a multilayer is easily formed and fine wiring is easily formed. Since it is possible to use Cu as a material of a wiring layer, it is possible to form wiring having a low electric resistance, and thus to improve the thermal conductivity. Further, the organic material of which the insulation layer is made has a lower thermal conductivity than Cu. Thus, in the organic substrate 120, the thermal conductivity in a plane direction that is a direction along a wire of the wiring layer is greater than the thermal conductivity in a thickness direction.

The inorganic substrate 110 is a substrate that includes an insulation layer made of an inorganic material such as ceramic. For example, aluminum oxide ($Al_3O$) and aluminum nitride (AlN) correspond to the ceramic. For example, a wiring layer made of tungsten (W) having a high melting point is used as the wiring layer of the inorganic substrate 110. The reason is that there is a need to use a material having a melting point higher than the firing temperature of ceramic. Further, in the inorganic substrate 110, the thermal conductivity in the plane direction and the thermal conductivity in the thickness direction are almost equal.

An inorganic material has a relatively low thermal expansion coefficient. Thus, the inorganic substrate 110 using an inorganic material as an insulation layer has the property of being less deformed due to a change in temperature. Further, it is possible to improve the stiffness and the moisture resistance, compared with an organic material.

On the other hand, in the imaging device 1, there is a need to reduce a wiring resistance of a wiring layer and to improve a speed of signal propagation, in order to transmit an image signal at a higher speed. As described above, the inorganic substrate 110 uses, for a wiring layer, W, which has a lower electric conductivity than Cu. There is a need to make a wiring layer of the inorganic substrate 110 thicker in order to reduce a wiring resistance. Further, there is also a need to form multilayered wiring since it is difficult to form fine wiring. Consequently, the inorganic substrate 110 is thicker than the organic substrate 120.

It is possible to improve a performance of the imaging device 1 by using such an organic substrate 120 and such an inorganic substrate 110 bonded to each other. For example, the substrate 100 warps with a change in temperature since the organic substrate 120 and the inorganic substrate 110 having different thermal expansion coefficients are arranged. It is possible to reduce a distortion of the imaging device 1 by the substrate 100 warping in a direction in which warpage of the imaging element 10 or the cover portion, a component of the imaging device 1 other than the substrate 100, is counteracted. This makes it possible to reduce a change in a distance between an imaging lens arranged outside of the imaging device 1 and the imaging element 10. The temperature of the imaging device 1 is changed, for example, in a process of bonding the cover portion that is performed in the process of producing the imaging device 1, or in a reflow soldering process performed when the imaging device 1 is mounted on a substrate (hereinafter referred to as a mother board) of, for example, a camera. Further, when the imaging device 1 is in use, there is also a change in temperature due to a change in ambient temperature or due to its own heat generation.

Further, it is possible to make the substrate 100 thicker. It is necessary that the inorganic substrate 110 include a thick wiring layer to reduce a wiring resistance, and be formed in multiple layers for routing of wiring. On the other hand, it is possible to make the substrate 100 thicker by arranging the organic substrate 120 and allocating a larger wiring region in the substrate 100 to the organic substrate 120 than the inorganic substrate 110. Further, compared to when the substrate 100 is formed only of the organic substrate 120, the arrangement of the inorganic substrate 110 makes it possible to improve the stiffness of the substrate 100, and to improve the moisture resistance and the airtightness of the substrate 100. Furthermore, compared to when the substrate 100 is formed only of the inorganic substrate 110, the arrangement of the organic substrate 120 makes it possible to make the substrate 100 lighter in weight. Moreover, the arrangement of the inorganic substrate 110, which is a less aged substrate, makes it possible to obtain the imaging device 1 having a high reliability.

Further, it is possible to optimize the heat dissipation of the imaging device 1 by using the organic substrate 120 and the inorganic substrate 110 having differing heat transfer properties in combination. When the imaging device 1 is mounted on a mother board, the thermal conductivity in the thickness direction is improved by increasing the proportion of the inorganic substrate 110. This results in being able to improve the heat dissipation in a direction of the mother board. Further, when the substrate 100 is fixed to a heat sink or the like, the thermal conductivity in the plane direction of the substrate 100 is improved by increasing the proportion of the organic substrate 120. This results in being able to improve the heat dissipation in a direction of the heat sink.

There is a need to join the organic substrate 120 and the inorganic substrate 110 to obtain the substrate 100 while ensuring an electric connection between the organic substrate 120 and the inorganic substrate 110. It is possible to join the organic substrate 120 and the inorganic substrate 110 using, for example, soldering.

[Configuration of Substrate]

Figure 4:
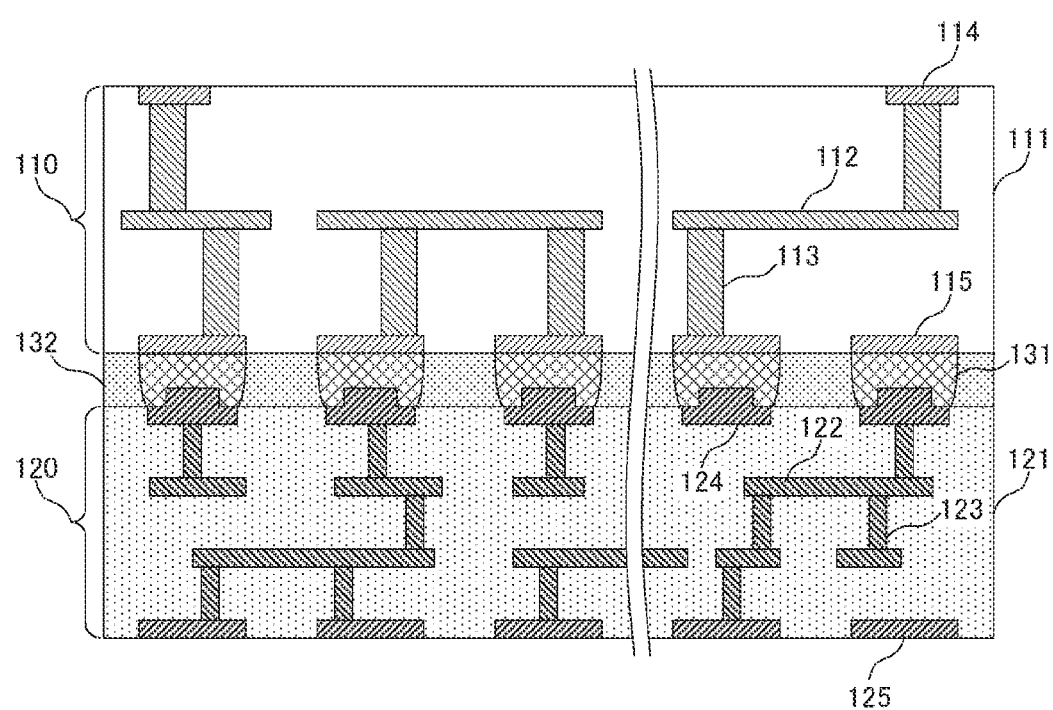
FIG. 4 illustrates a configuration example of a substrate according to the first embodiment of the present disclosure.

FIG. 4 illustrates a configuration example of the substrate according to the first embodiment of the present disclosure. The figure illustrates a configuration of the substrate 100 described with reference to FIG. 3A. The configuration of the substrate 100 is described using the substrate 100 of FIG. 4 an example. The substrate 100 includes the inorganic substrate 110, the organic substrate 120, a solder 131, and a bonding member 132.

The inorganic substrate 110 illustrated in the figure includes the pad 114 arranged on a surface on which the imaging element 10 is arranged, and a pad 115 arranged on the opposite surface. The pad 114 is provided with the conductive wire 30 using wire bonding. The pad 115 is connected to the organic substrate 120 using the solder 131 described later. In the inorganic substrate 110, a wiring layer 112 is arranged in an inner layer of an insulation layer 111 made of an inorganic material. A plurality of wires may be formed in the wiring layer 112. The wiring layer 112 is connected to each of the pads 114 and 115 through a vias 113. Note that a plurality of wiring layers may also be arranged to form multilayered wiring.

The organic substrate 120 illustrated in the figure includes a pad 124 arranged on a surface on which the organic substrate 120 is joined to the inorganic substrate 110, and a pad 125 arranged on the opposite surface. A bump may be formed in the pad 124. Here, the bump is a protrusion formed in, for example, a pad, and is arranged in order to improve a strength of connection performed using, for example, soldering. In the organic substrate 120, a wiring layer 122 is arranged in an inner layer of an insulation layer 121 made of an organic material. The figure illustrates an example in which the wiring layer 122 is arranged in two layers. The wiring layers 122 are connected to each other through a vias 123, and the wiring layer 122 is connected to each of the pads 124 and 125 through the vias 123. Note that the wiring layer 122 may be arranged in a single layer or in three or more layers. For example, the pad 125 may be used to connect the wiring layer 122 to a mother board.

The solder 131 is used to connect the pad 115 of the inorganic substrate 110 and the pad 124 of the organic substrate 120. Note that the solder 131 is an example of a conductive material according to an embodiment of the present disclosure.

The bonding member 132 is used to bond the inorganic substrate 110 and the organic substrate 120. For example, a resin having adhesion properties may be used for the bonding member 132. Specifically, a non-conductive film (NCF), a non-conductive paste (NCP), an underfill material, and a commonly used adhesive may be used. The arrangement of the bonding member 132 makes it possible to reinforce connection performed using the solder 131.

The connection between the inorganic substrate 110 and the organic substrate 120 is not limited to this example. For example, a bump may be formed in one or both of the pads 115 and 124, and the bump and the pad or the bumps may be connected to each other using heating pressure welding, without using the solder 131.

Note that, in order to obtain the imaging device 1 described with reference to FIG. 3B, it is possible to apply a substrate obtained by turning the substrate 100 of FIG. 4 upside down. In this case, the conductive wire 30 is connected to the pad 125 of the organic substrate 120. It is possible to use the pad 114 of the inorganic substrate 110 to, for example, connect the imaging device 1 to the mother board.

The configuration of the substrate 100 is not limited to this example. For example, it is also possible to use the substrate 100 obtained by using a substrate made of an inorganic material as a core substrate and by stacking an insulation layer and a wiring layer on one of or both of the surfaces of the core substrate, the insulation layer and the wiring layer being made of an organic material. In this case, the core substrate corresponds to the inorganic substrate 110, and the insulation layer and the wiring layer that are stacked on the core substrate correspond to the organic substrate 120. A substrate made of ceramic or an insulated metal may be used as the core substrate.

[State in which Imaging Device is Mounted]

Figure 5A:
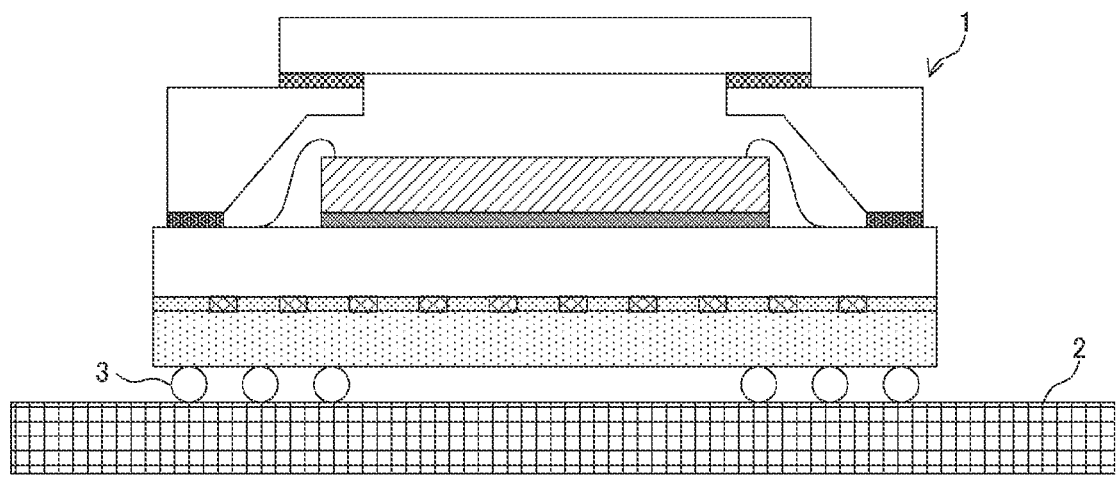
FIGS. 5A and 5B illustrate an example of a state in which the imaging device is mounted according to the first embodiment of the present disclosure.
Figure 5B:
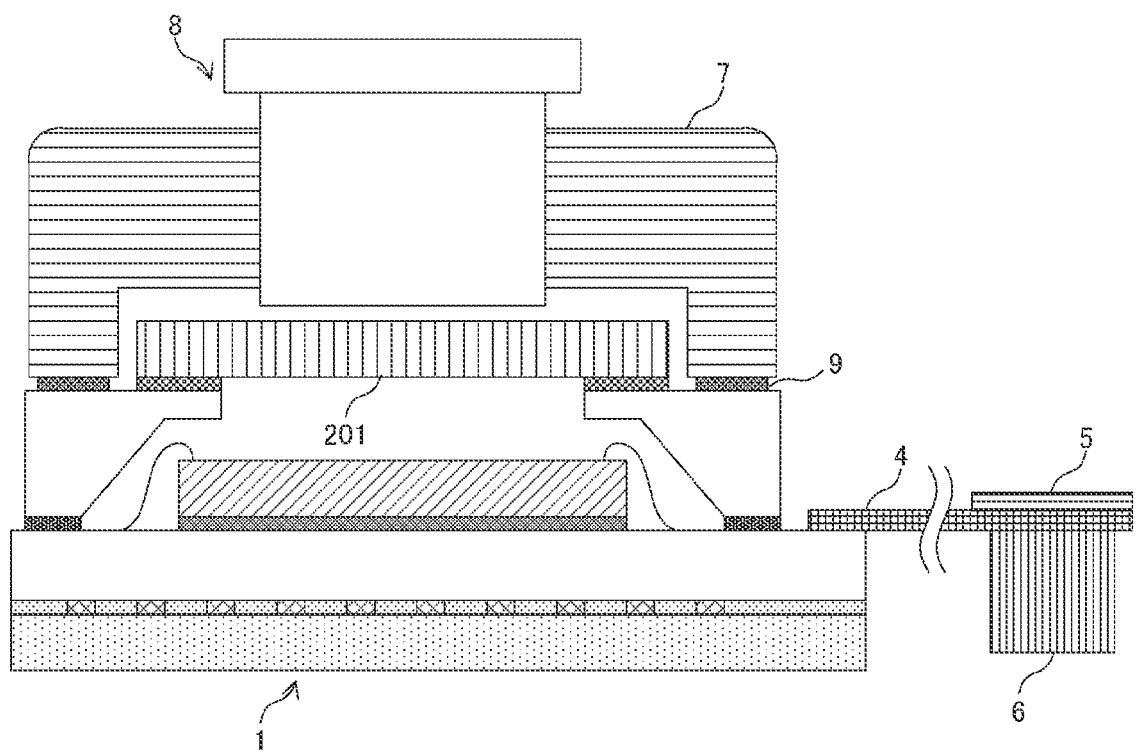

FIGS. 5A and 5B illustrate an example of a state in which the imaging device is mounted according to the first embodiment of the present disclosure. FIG. 5A illustrates an example in which the imaging device 1 is mounted on the mother board described above. In FIG. 5A, the imaging device 1 is mounted on a mother board 2 through the solder ball 3.

FIG. 5B illustrates an example in which the imaging device 1 is included in a camera module. Instead of the seal glass 50, a filter 201 is arranged in the imaging device 1 illustrated in FIG. 5B. The filter 201 blocks light of a specified wavelength. For example, the filter 201 may block infrared light. The camera module further includes an actuator 7 that drives a lens-barrel 8 and a lens of the lens-barrel 8. The lens-barrel 8 is a cylindrical housing that supports an imaging lens that forms an image of a subject in the imaging element 10. The actuator 7 changes the position of the imaging lens of the lens-barrel 8 to bring the subject into focus. The actuator 7 is bonded to an upper surface of the frame 40 using an adhesive 9. Further, a flexible wiring board 4 is connected to the substrate 100, and a connector 6 is arranged in the flexible wiring board 4. A signal of the substrate 100 is transmitted to, for example, a camera through the flexible wiring board 4 and the connector 6. A film 5 for reinforcement may be arranged on the back side of a surface of the flexible wiring board 4, the surface being a surface on which the connector 6 is arranged.

[Method for Producing Imaging Device]

Figure 6A:
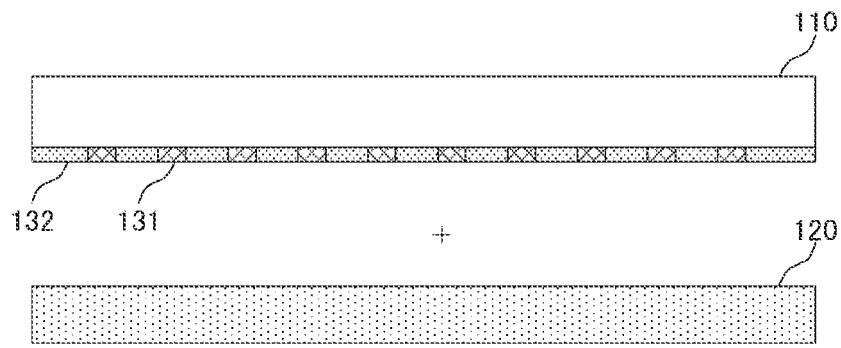
FIGS. 6A, 6B, 6C, and 6D illustrate an example of a method for producing the imaging device according to the first embodiment of the present disclosure.
Figure 6B:
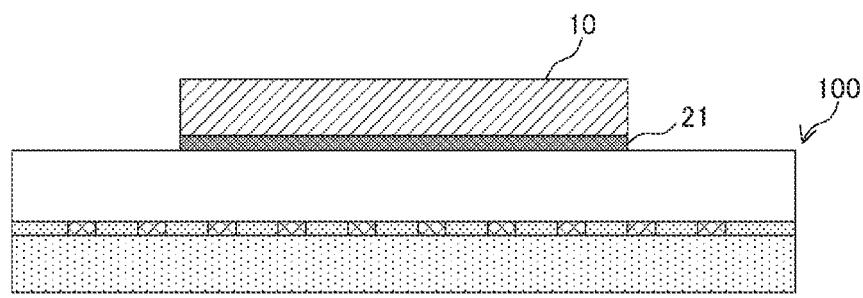
Figure 6C:
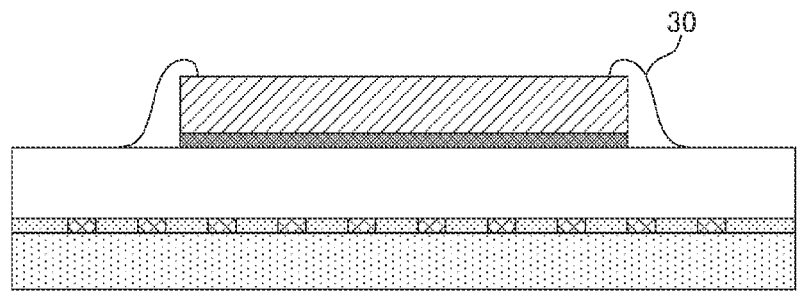
Figure 6D:
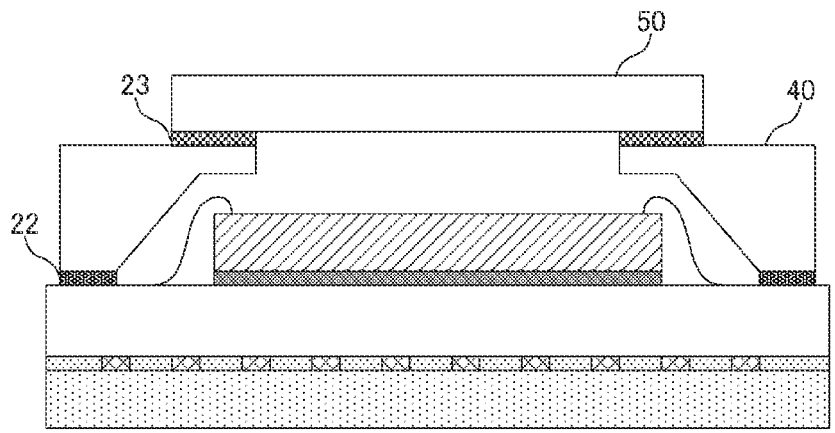

FIGS. 6A, 6B, 6C, and 6D illustrate an example of a method for producing the imaging device according to the first embodiment of the present disclosure. The figure illustrates an example of a process of producing the imaging device 1. First, the solder 131 and the bonding member 132 are arranged on the inorganic substrate 110. Next, the inorganic substrate 110 on which the solder 131 and the bonding member 132 are arranged is bonded to the organic substrate 120 to form the substrate 100. This can be performed, for example, by reflow soldering (FIG. 6A). Next, the imaging element 10 is bonded to the substrate 100 using the die-bonding material 21. This can be performed by the imaging element 10 being die-bonded to the substrate 100 through the die-bonding material 21 (FIG. 6B). This process is an example of bonding an imaging element according to an embodiment of the present disclosure. Next, wire bonding is performed to connect the imaging element 10 to the substrate 100 using the conductive wire 30 (FIG. 6C of electric conduction). This process corresponds to connecting a substrate and an imaging element according to an embodiment of the present disclosure. Next, the frame 40 is bonded to the substrate 100 using the adhesive 22, and the seal glass 50 is bonded to the frame 40 using the adhesive 23 (FIG. 6D). The processes described above make it possible to produce the imaging device 1.

As described above, in the imaging device 1 according to the first embodiment of the present disclosure, the arrangement of the substrate 100 formed of the organic substrate 120 and the inorganic substrate 110 makes it possible to reduce deformation of the imaging device 1 due to a change in temperature. This makes it possible to prevent a reduction in image quality.

2. Second Embodiment

In the imaging device 1 of the first embodiment described above, the imaging element 10 is bonded to the substrate 100, and the imaging element 10 is connected to the substrate 100 using the conductive wire 30. On the other hand, the imaging device 1 of a second embodiment of the present disclosure is different from the first embodiment described above in that the imaging element 10 is flip-chip mounted.

[Configuration of Imaging Device]

Figure 7A:
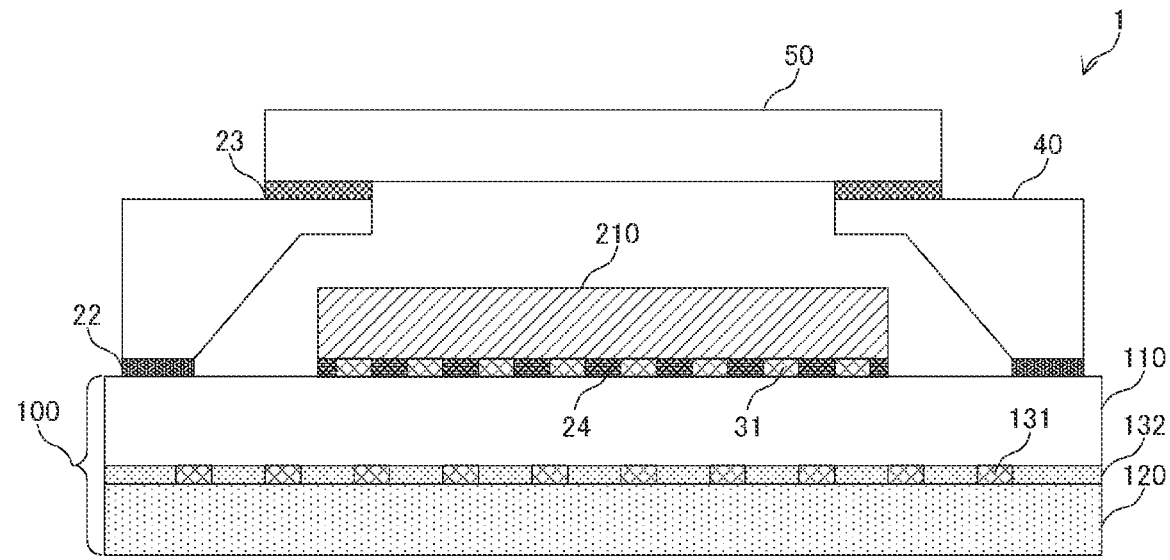
FIGS. 7A and 7B illustrate a configuration example of the imaging device according to a second embodiment of the present disclosure.
Figure 7B:
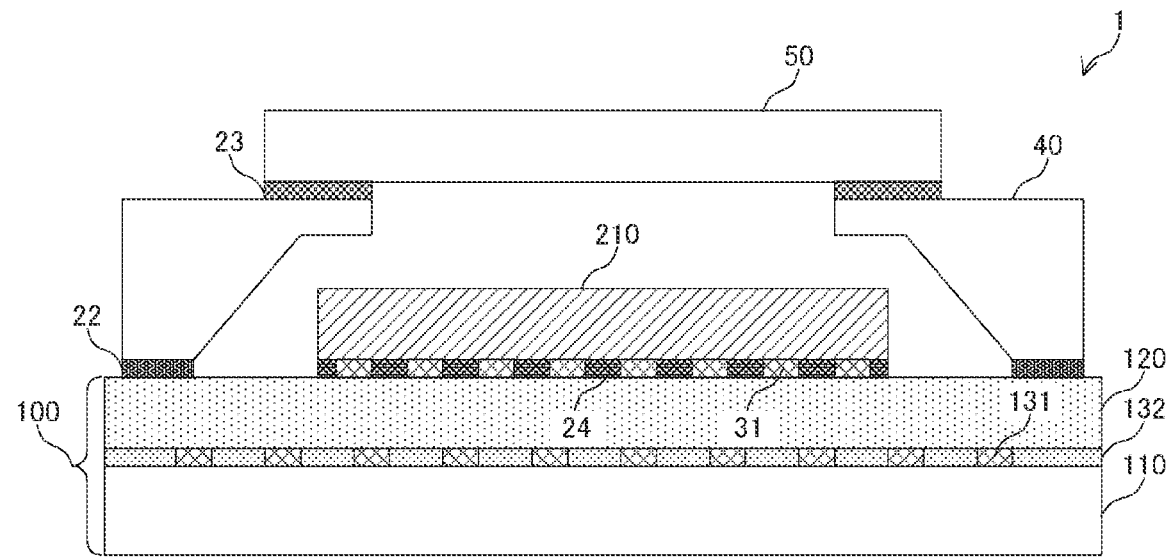

FIGS. 7A and 7B illustrate a configuration example of the imaging device according to the second embodiment of the present disclosure. The imaging device 1 illustrated in the figure is different from the imaging device 1 described with reference to FIGS. 3A and 3B in that an imaging element 210 is arranged instead of the imaging element 10 and is connected to the substrate 100 using a solder 31. Further, the imaging element 210 and the substrate 100 are bonded to each other using a bonding member 24.

The imaging element 210 is an imaging element in which a pad is arranged on a surface of the imaging element 210 that is different from its light-receiving surface on which the pixel array 11 is arranged. The solder 31 is arranged between the pad arranged on the surface different from the light-receiving surface, and a pad of the substrate 100, and the solder 31 performs connection. Further, as in the case of the bonding member 132, NCF or NCP may be used for the bonding member 24.

FIG. 7A illustrates an example in which the imaging element 210 is arranged on the inorganic substrate 110, and FIG. 7B illustrates an example in which the imaging element 210 is arranged on the organic substrate 120.

For example, the solder 31 and the bonding member 24 are arranged on the surface of the imaging element 210 that is different from its light-receiving surface, and the imaging element 210 is placed on the substrate 100 to performing reflow soldering. This makes it possible to produce the imaging device 1 illustrated in the figure. Such flip-chip mounting makes it possible to omit the conductive wire 30. This results in being able to make the imaging device 1 shorter in height, and to make a connection region smaller. Further, it is possible to reduce a connection resistance since it is possible to make a distance between pads smaller. It is possible to simplify the process of producing the imaging device 1 since bonding of the imaging element 210 to the substrate 100 and an electric connection of the imaging element 210 with the substrate 100 can be performed at the same time using flip-chip mounting.

Note that the connection between the imaging element 210 and the substrate 100 is not limited to this example. For example, a bump may be formed in one of or both of the pad of the imaging element 210 and the pad of substrate 100, and connection may be performed using heating pressure welding, without using the solder 31.

Except for the points described above, the imaging element 1 has a configuration similar to the configuration of the imaging element 1 described in the first embodiment of the present disclosure. Thus, the description is omitted.

As described above, with respect to the imaging device 1 of the second embodiment of the present disclosure, the imaging element 210 in which a pad is arranged on the surface of the imaging element 210 that is different from its light-receiving surface, is flip-chip mounted on the substrate 100 to obtain the imaging device 1. This makes it possible to make the imaging device 1 shorter in height.

3. Third Embodiment

In the imaging device 1 of the first embodiment described above, the imaging element 10 is bonded to the surface of the substrate 100 formed of the organic substrate 120 and the inorganic substrate 110 that are bonded to each other. On the other hand, the imaging device 1 of the second embodiment of the present disclosure is different from the first embodiment described above in that the imaging element 10 is arranged in an opening formed in the organic substrate 120 or the inorganic substrate 110.

[Configuration of Imaging Device]

Figure 8A:
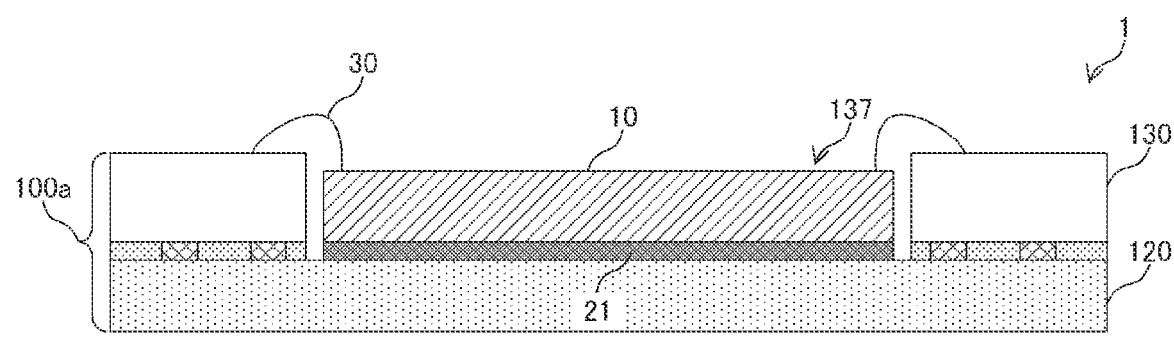
FIGS. 8A and 8B illustrate a configuration example of the imaging device according to a third embodiment of the present disclosure.
Figure 8B:
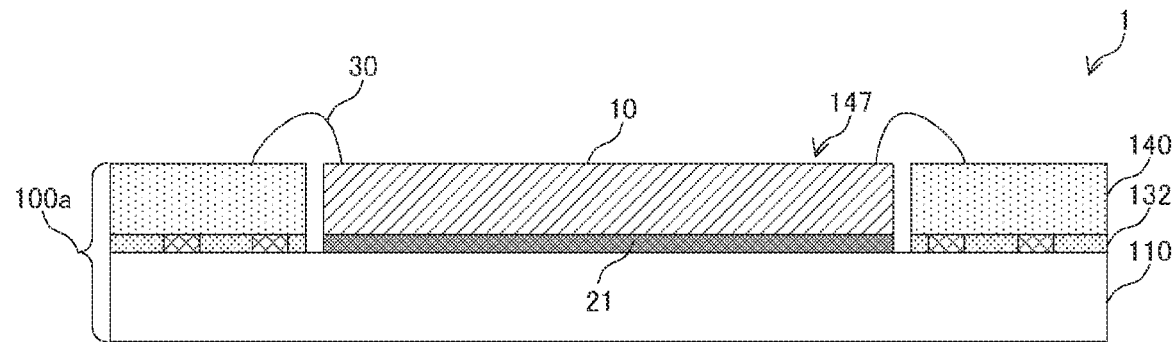

FIGS. 8A and 8B illustrate a configuration example of the imaging device according to a third embodiment of the present disclosure. In the figure, illustrations of the frame 40 and the seal glass 50 are omitted. In a substrate 100a illustrated in the figure, an opening is formed in an organic substrate or an inorganic substrate. The imaging element 10 is bonded to the substrate in which the opening is not formed through the opening, and is connected to the substrate in which opening is formed.

FIG. 8A illustrates an example of the imaging device 1 including the substrate 100a formed of an inorganic substrate 130 in which an opening 137 is formed, and the organic substrate 120. The imaging element 10 is bonded to the organic substrate 120 using the die-bonding material 21 through the opening 137 of the inorganic substrate 130. Further, the imaging element 10 is connected to the inorganic substrate 130 using the conductive wire 30.

FIG. 8B illustrates an example of the imaging device 1 including the substrate 100a formed of an organic substrate 140 in which an opening 147 is formed, and the inorganic substrate 110. The imaging element 10 is bonded to the inorganic substrate 110 through the opening 147 of the organic substrate 140. Further, the imaging element 10 is connected to the organic substrate 140 using the conductive wire 30.

Compared to the case of bonding the imaging element 10 to the substrate 100 described with reference to FIGS. 3A and 3B, it is possible to make the imaging device 1 shorter in height by accommodating the imaging element 10 in the opening 137 or 147, as illustrated in the figure. Further, the entirety of, for example, the image-capturing module described with reference to FIG. 5A can also be made shorter in height. An imaging lens of, for example, the image-capturing module is installed, with the surface of the imaging element 10 being used as a reference. Thus, in the imaging device 1 illustrated in the figure that is formed such that the imaging element 10 is buried in a substrate, it is possible to arrange the imaging lens closer to the imaging element 10. Further, it is also possible to make the imaging device 1 lighter in weight since an opening is formed in an organic substrate or an inorganic substrate. Note that, as in the case of the imaging device 1 described with reference to FIGS. 3A and 3B, the adjustment of, for example, the thicknesses of the organic substrate and the inorganic substrate makes it possible to reduce deformation of the imaging device 1.

Except for the points described above, the imaging element 1 has a configuration similar to the configuration of the imaging element 1 described in the first embodiment of the present disclosure. Thus, the description is omitted.

As described above, in the imaging device 1 according to the third embodiment of the present disclosure, the opening 137 is formed in the inorganic substrate 110 or the opening 147 is formed in the organic substrate 120, the organic substrate 120 and the inorganic substrate 110 forming the substrate 100, and the imaging element 10 is bonded to the other substrate through the opening. This results in being able to make the imaging device 1 shorter in height, and to make, for example, a camera using the imaging device 1 smaller in size.

4. Fourth Embodiment

In the imaging device 1 of the third embodiment described above, the substrate 100a including an opening in the inorganic substrate 130 or the organic substrate 140 is used, and the imaging element 10 bonded to the other substrate through the opening is connected to the substrate including the opening, using the conductive wire 30. On the other hand, the imaging device 1 of a fourth embodiment of the present disclosure is different from the third embodiment in that the imaging element is flip-chip mounted.

[Configuration of Imaging Device]

Figure 9A:
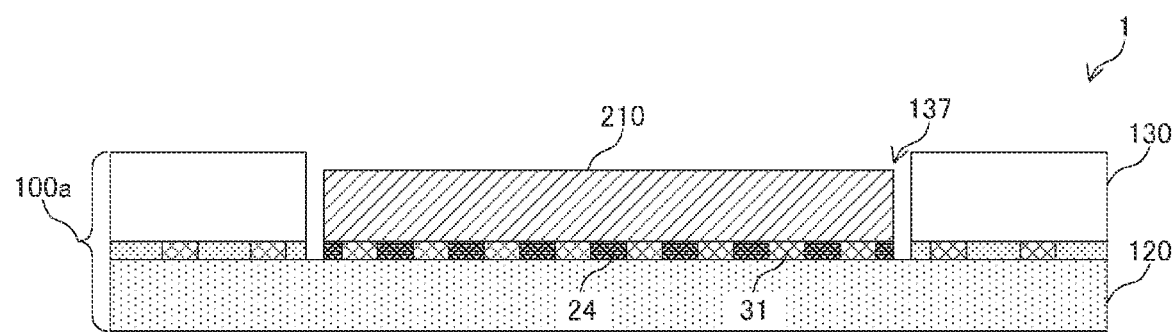
FIGS. 9A and 9B illustrate a configuration example of the imaging device according to a fourth embodiment of the present disclosure.
Figure 9B:
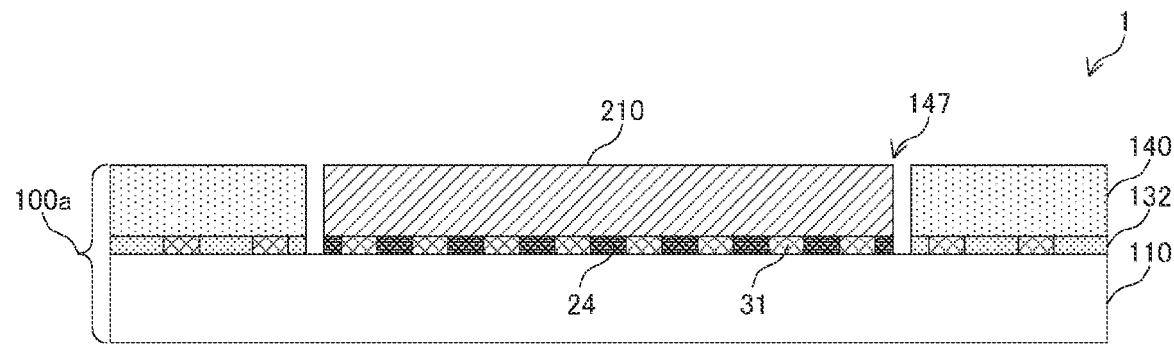

FIGS. 9A and 9B illustrate a configuration example of the imaging device according to the fourth embodiment of the present disclosure. The imaging device 1 illustrated in the figure is different from the imaging device 1 described with reference to FIGS. 8A and 8B in that the imaging element 210 is arranged instead of the imaging element 10, is connected to the substrate 100 using the solders 31, and is bonded to the substrate 100 using the bonding member 24.

FIG. 9A illustrates an example in which the imaging element 210 is bonded to the organic substrate 120 through the opening 137 of the inorganic substrate 130. The solder 31 is arranged between the pad of the imaging element 210 and the pad 124 of organic substrate 120 to connect these pads.

FIG. 9B illustrates an example in which the imaging element 210 is bonded to the inorganic substrate 110 through the opening 147 of the organic substrate 140. The solder 31 is arranged between the pad of the imaging element 210 and the pad 114 of the inorganic substrate 110 to perform connection.

In the imaging device 1 illustrated in the figure, the conductive wire 30 is not used. This makes it possible to make the imaging device 1 even shorter in height than the imaging device 1 described with reference to FIGS. 8A and 8B.

Note that the connection between the imaging element 210 and the substrate 100 is not limited to this example. For example, a bump may be formed in one of or both of the pad of the imaging element 210 and the pad of substrate 100, and connection may be performed using heating pressure welding, without using the solder 31.

Except for the points described above, the imaging element 1 has a configuration similar to the configuration of the imaging element 1 described in the first embodiment of the present disclosure. Thus, the description is omitted.

As described above, the imaging device 1 of the fourth embodiment of the present disclosure uses the imaging element 210 in which a pad is arranged on the surface of the imaging element 210 that is different from its light-receiving surface, and the imaging element 210 is flip-chip mounted through the opening. This results in being able to make the imaging device 1 even shorter in height.

5. Fifth Embodiment

In the imaging device 1 of the fourth embodiment described above, the substrate 100a including an opening in the inorganic substrate 130 or the organic substrate 140 is used, and the imaging element 210 is flip-chip mounted on the other substrate through the opening. On the other hand, the imaging device 1 of a fifth embodiment of the present disclosure is different from the fourth embodiment described above in that an opening is further formed in a substrate on which the imaging element 10 is flip-chip mounted.

[Configuration of Imaging Device]

Figure 10A:
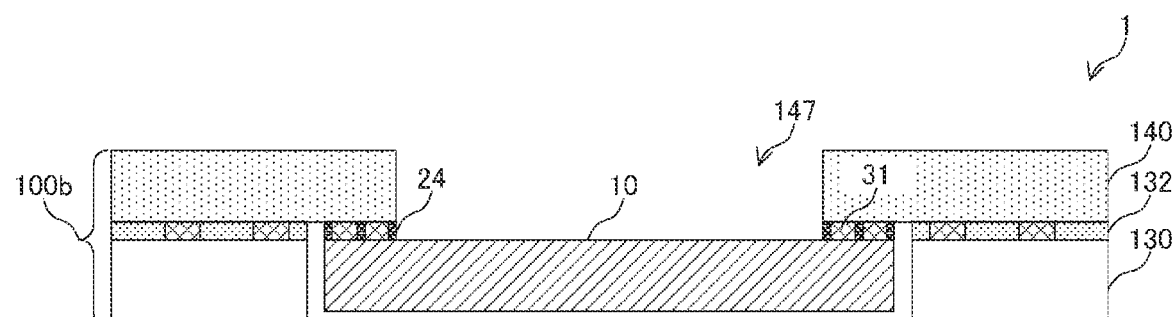
FIGS. 10A and 10B illustrate a configuration example of the imaging device according to a fifth embodiment of the present disclosure.
Figure 10B:
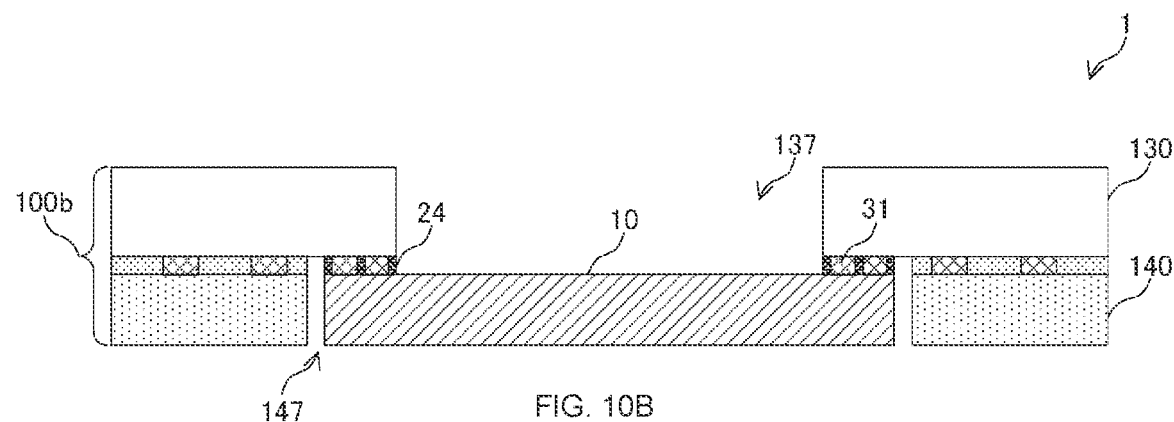

FIGS. 10A and 10B illustrate a configuration example of the imaging device according to the fifth embodiment of the present disclosure. The imaging device 1 illustrated in the figure is different from the imaging device 1 described with reference to FIGS. 9A and 9B in that the imaging element 10 is arranged instead of the imaging element 210 and an opening is further formed in an organic substrate or an inorganic substrate to which the imaging element 10 is bonded. Incident light is irradiated onto the imaging element 10 through the opening formed in the substrate to which the imaging element 10 is bonded.

The figure illustrates an example of the imaging device 1 including a substrate 100b formed of the inorganic substrate 130 in which the opening 137 is formed, and the organic substrate 140 in which the opening 147 is formed. In the imaging device 1 illustrated in FIG. 10A, the imaging element 10 is flip-chip mounted on the organic substrate 140 through the opening 137 of the inorganic substrate 130. Incident light is irradiated onto the imaging element 10 illustrated in FIG. 10A through the opening 147 of the organic substrate 140.

In the imaging device 1 illustrated in FIG. 8B, the imaging element 10 is flip-chip mounted on the inorganic substrate 130 through the opening 147 of the organic substrate 140. Incident light is irradiated onto the imaging element 10 illustrated in FIG. 8B through the opening 137 of the inorganic substrate 130.

With respect to the imaging device 1 illustrated in the FIGS. 9A and 9B, the imaging element 10 including a pad formed on its light-receiving surface, and flip-chip mounting is performed to obtain the imaging device 1. Since an opening is formed in both an organic substrate and an inorganic substrate, it is possible to make the imaging device 1 even lighter in weight than the imaging device 1 described with reference to FIGS. 9A and 9B. Further, the light-receiving surface of the imaging element 10 is arranged near a junction of the organic substrate 140 and the inorganic substrate 130 in the substrate 100b. Thus, it is possible to arrange an imaging lens closer to the imaging device 1, compared to the case of the imaging device 1 described with reference to FIGS. 9A and 9B. This results in being able to make an image-capturing module even smaller in size. Note that the opening 147 illustrated in FIG. 9A and the opening 137 illustrated in FIG. 9B are examples of a second opening according to an embodiment of the present disclosure.

Note that the connection between the imaging element 10 and the substrate 100 is not limited to this example. For example, a bump may be formed in one of or both of the pad of the imaging element 10 and the pad of substrate 100, and connection may be performed using heating pressure welding, without using the solder 31.

Except for the points described above, the imaging element 1 has a configuration similar to the configuration of the imaging element 1 described in the first embodiment of the present disclosure. Thus, the description is omitted.

As described above, the imaging device 1 according to the fifth embodiment of the present disclosure includes an organic substrate and an inorganic substrate each including an opening. Through the opening of one of the organic substrate and the inorganic substrate, the imaging element 10 is bonded to the other substrate, and incident light is irradiated onto the imaging element 10 through the opening of the other substrate. This makes it possible to obtain the imaging device 1 by performing flip-chip mounting on the imaging element 10 including a pad formed on its light-receiving surface. This results in being able to make the imaging device 1 even shorter in height.

Finally, the descriptions of the respective embodiments above are examples of the present disclosure, and the present disclosure is not limited to the embodiments described above. Thus, various modifications may of course be made depending on the design and the like without departing from the technical idea according to the present disclosure even in the case of an embodiment other than the embodiments described above.

Note that the present technology may also take the following configurations.

(1) An imaging device, including:
    an imaging element;
    a substrate to which the imaging element is bonded, the substrate being formed of an organic substrate and an inorganic substrate, the organic substrate including an insulation layer that is made of an organic material, the inorganic substrate including an insulation layer that is made of an inorganic material; and
    a connection portion that connects the substrate and the imaging element.

(2) The imaging device according to (1), in which
    the imaging element is bonded to a surface of the organic substrate or the inorganic substrate, and
    the connection portion connects the substrate to which the imaging element is bonded, and the imaging element.

(3) The imaging device according to (1), in which
    one of the organic substrate and the inorganic substrate includes an opening, and
    the imaging element is bonded to another of the organic and inorganic substrates through the opening.

(4) The imaging device according to (3), in which
    the connection portion connects the substrate including the opening and the imaging element.

(5) The imaging device according to (3), in which
    the connection portion connects the substrate to which the imaging element is bonded, and the imaging element.

(6) The imaging device according to (3) or (5), in which
    the substrate to which the imaging element is bonded includes a second opening, and
    the imaging element is irradiated with incident light through the second opening.

(7) The imaging device according to any one of (1) to (6), in which
    the substrate is formed by joining the organic substrate and the inorganic substrate using a conductive material.

(8) The imaging device according to any one of (1) to (7), in which
    the connection portion is formed of a conductive wire.

(9) The imaging device according to any one of (1) to (7), in which
    the connection portion is formed of a solder.

(10) The imaging device according to any one of (1) to (7), in which
    the connection portion is formed of a bump that is formed in at least one of the substrate or the imaging element.

(11) The imaging device according to any one of (1) to (10), in which
the organic substrate includes a wiring layer that is made of copper.
(12) The imaging device according to any one of (1) to (11), further including
a cover portion that covers the imaging element.
(13) A method for producing an imaging device, the method including:
bonding an imaging element to a substrate that is formed of an organic substrate and an inorganic substrate, the organic substrate including an insulation layer that is made of an organic material, the inorganic substrate including an insulation layer that is made of an inorganic material; and
connecting the substrate and the imaging element using a connection portion that is used to connect the substrate and the imaging element.

REFERENCE SIGNS LIST 1 imaging device
7 actuator
8 lens-barrel
10, 210 imaging element
11 pixel array
12 pixel
21 die-bonding material
24, 132 bonding member
30 conductive wire
31, 131 solder
40 frame
50 seal glass
100, 100a, 100b substrate
110, 130 inorganic substrate
114, 115, 124, 125 pad
120, 140 organic substrate
137, 147 opening

The invention claimed is:
1. An imaging device, comprising:
an imaging element;
a substrate to which the imaging element is bonded, wherein:
  the substrate is formed of an organic substrate and an inorganic substrate,
  the organic substrate includes:
    an insulation layer that is made of an organic material, and
    a wiring layer made up of a material that has a low electric resistance,
  the inorganic substrate includes:
    an insulation layer that is made of an inorganic material, and
    a plurality of wiring layers of a material having a melting point higher than a firing temperature of the inorganic material,
  a thickness of each wiring layer of the plurality of wiring layers of the inorganic substrate is greater than a thickness of the wiring layer of the organic substrate, and
  a thermal expansion coefficient of the inorganic substrate is lower than a thermal expansion coefficient of the organic substrate; and
a connection portion that connects the substrate and the imaging element.

2. The imaging device according to claim 1, wherein
the imaging element is bonded to a surface of the organic substrate or the inorganic substrate, and
the connection portion connects the substrate to which the imaging element is bonded, and the imaging element.
3. The imaging device according to claim 1, wherein
one of the organic substrate and the inorganic substrate includes an opening, and
the imaging element is bonded to another of the organic and inorganic substrates through the opening.
4. The imaging device according to claim 3, wherein the connection portion connects the substrate including the opening and the imaging element.
5. The imaging device according to claim 3, wherein the connection portion connects the substrate to which the imaging element is bonded, and the imaging element.
6. The imaging device according to claim 3, wherein
the substrate to which the imaging element is bonded includes a second opening, and
the imaging element is irradiated with an incident light through the second opening.
7. The imaging device according to claim 1, wherein:
the substrate further includes a conductive material, and
the conductive material connects the organic substrate and the inorganic substrate.
8. The imaging device according to claim 1, wherein the connection portion is formed of a conductive wire.
9. The imaging device according to claim 1, wherein the connection portion is formed of a solder.
10. The imaging device according to claim 1, wherein the connection portion is formed of a bump that is formed in at least one of the substrate or the imaging element.
11. The imaging device according to claim 1, wherein the organic substrate includes the wiring layer made of copper.
12. The imaging device according to claim 1, further comprising a cover portion that covers the imaging element.
13. A method for producing an imaging device, the method comprising:
bonding an imaging element to a substrate that is formed of an organic substrate and an inorganic substrate, wherein:
  the organic substrate includes:
    an insulation layer that is made of an organic material, and
    a wiring layer made up of a material that has a low electric resistance,
  the inorganic substrate includes:
    an insulation layer that is made of an inorganic material, and
    a plurality of wiring layers of a material having a melting point higher than a firing temperature of the inorganic material,
  a thickness of each wiring layer of the plurality of wiring layers of the inorganic substrate is greater than a thickness of the wiring layer of the organic substrate, and
  a thermal expansion coefficient of the inorganic substrate is lower than a thermal expansion coefficient of the organic substrate; and
connecting the substrate and the imaging element using a connection portion that is used to connect the substrate and the imaging element.
14. The imaging device according to claim 1, wherein:
the imaging element is bonded to the substrate via solders and a bonding member,
the solders and the bonding member are arranged on a surface of the imaging element that is different from a light-receiving surface of the imaging element, and
the imaging element is flip-chip mounted on the substrate.

15. The imaging device according to claim 1, wherein a thermal conductivity of the inorganic substrate in a plane direction of the inorganic substrate and a thermal conductivity of the inorganic substrate in a thickness direction of the inorganic substrate are almost equal.

16. The imaging device according to claim 1, wherein the inorganic substrate is thicker than the organic substrate.

17. The imaging device according to claim 1, wherein the inorganic substrate further includes:
   a pad on a surface of the inorganic substrate, and
   a via that connects the plurality of wiring layers to the pad.

* * * * *